(12) United States Patent
Ward

(10) Patent No.: US 8,227,813 B2
(45) Date of Patent: Jul. 24, 2012

(54) LED LIGHT SOURCE UTILIZING MAGNETIC ATTACHMENT

(75) Inventor: Calvin B. Ward, Castro Valley, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/888,153

(22) Filed: Sep. 22, 2010

(65) Prior Publication Data

US 2012/0068621 A1 Mar. 22, 2012

(51) Int. Cl.
*H01L 27/15* (2006.01)

(52) U.S. Cl. ............... 257/79; 257/99; 257/706

(58) Field of Classification Search .......... 362/234, 362/253, 276, 295, 249.02, 249.04, 800, 362/802; 257/79, 88, 99, 678, 680, 701, 257/706
See application file for complete search history.

(56) References Cited

U.S. PATENT DOCUMENTS

| | | | |
|---|---|---|---|
| 7,157,744 B2 * | 1/2007 | Palmteer et al. | 257/98 |
| 7,679,099 B2 * | 3/2010 | Pang | 257/99 |
| 7,745,832 B2 * | 6/2010 | Hsieh et al. | 257/79 |
| 7,815,338 B2 | 10/2010 | Siemiet et al. | |
| 7,926,975 B2 | 4/2011 | Siemiet et al. | |
| 7,938,562 B2 | 5/2011 | Ivey et al. | |
| 7,946,729 B2 | 5/2011 | Ivey et al. | |
| 2004/0222433 A1 * | 11/2004 | Mazzochette et al. | 257/99 |
| 2006/0193131 A1 | 8/2006 | McGrath et al. | |
| 2008/0192508 A1 | 8/2008 | Busby | |
| 2009/0179216 A1 * | 7/2009 | Xuan et al. | 257/98 |
| 2009/0273925 A1 * | 11/2009 | Schultz et al. | 362/249.01 |
| 2010/0320896 A1 | 12/2010 | Pet et al. | |
| 2011/0127917 A1 * | 6/2011 | Roberts et al. | 315/161 |
| 2011/0151588 A1 * | 6/2011 | Ashdown et al. | 438/3 |

OTHER PUBLICATIONS

International Search Report, PCT/US2011/051569, Dec. 28, 2011.

* cited by examiner

*Primary Examiner* — Tung X Le
(74) *Attorney, Agent, or Firm* — Calvin B. Ward

(57) ABSTRACT

A light module and method for using the same are disclosed. The light module includes a heat-conducting structure and a plurality of LEDs bonded to a heat-conducting structure. The LEDs are bonded to a first surface of the heat-conducting structure and are mounted on the heat-conducting structure such that at least 50 percent of the heat generated by the LEDs is transferred to the heat-conducting structure. The heat-conducting structure includes a ferromagnetic material and is structured such that the heat-conducting structure bonds magnetically to a heat-dissipating structure with sufficient force to support the light module during the normal operation thereof when the light source is placed against the heat-dissipating structure. The present invention can be utilized for retrofitting an existing light fixture having an enclosure that includes a ferromagnetic material and a plurality of legacy light sources.

18 Claims, 6 Drawing Sheets

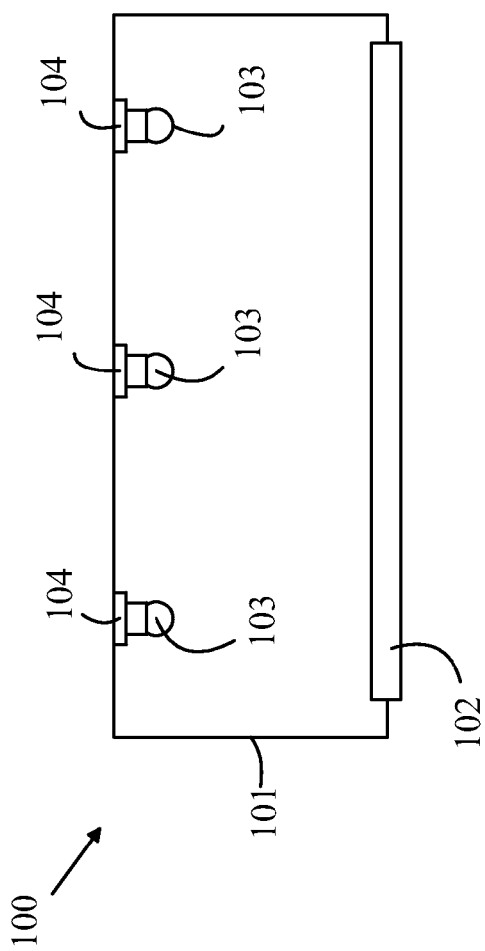
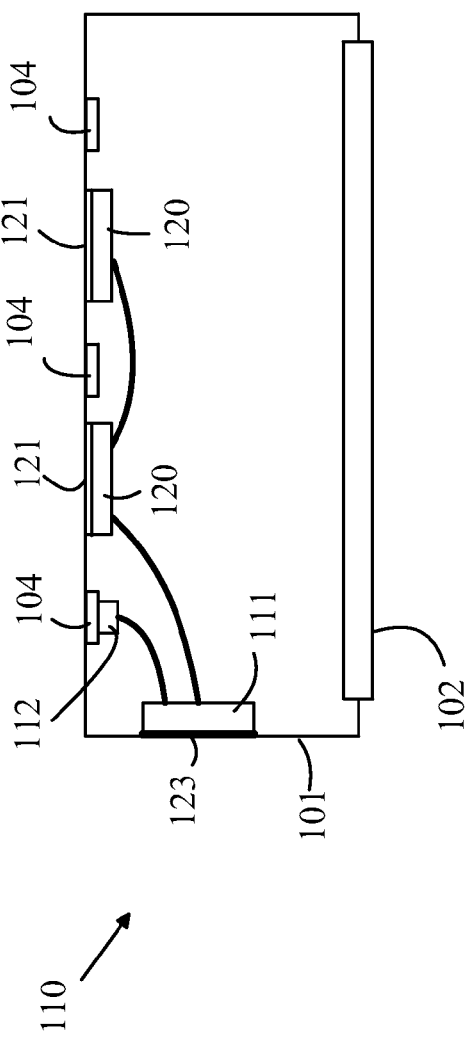

LED LIGHT SOURCE UTILIZING MAGNETIC ATTACHMENT

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes than both incandescent bulbs and fluorescent tubes. In addition, the efficiency of conversion of electricity to light has now reached the same levels as obtained in fluorescent light fixtures.

LED sources that are to replace conventional lighting generate significant amounts of heat that must be transferred to the environment without raising the operating temperature of the LEDs to levels that unacceptably decrease the efficiency or lifetime of the LEDs. The efficiency of conversion of electricity to light in an LED decreases with increasing temperature. Similarly, the lifetime of the LED also decreases with temperature. To replace conventional lighting, LED sources that dissipate 10 to 100 watts of heat are required. For example, an LED-based replacement for a fluorescent tube assembly having two 4-foot T12 tubes must dissipate more than 50 watts. To move this amount of heat from the LEDs without increasing the LED temperature to an unacceptable level presents design challenges and is the subject of numerous patents.

Typically, the LEDs are mounted on some form of heat-conducting structure that moves the heat from the LED dies to a second heat-dissipating structure that transfers the heat to the ambient environment, usually to the air that is in contact with a heat-dissipating surface. To maintain the temperature of the LEDs at acceptable levels, the heat-conducting structure is usually a layer of a metal such as copper or aluminum and held at an acceptable temperature by bonding the heat-conducting structure to a much larger surface that is used to dissipate the heat. In some applications a fan is utilized to move the air across the larger area heat-dissipating surface to reduce the area needed to dissipate the heat.

In situations in which an existing luminaire is being upgraded by replacing a conventional light source such as a number of fluorescent tubes with an LED-based light source, the problems associated with mounting the replacement light source that includes the heat-conducting structure to the final heat-dissipating structure can present significant challenges. The final heat-dissipating structure can be part of the existing luminaire or a separate structure that is part of the replacement light source. If the replacement light source matches the form factor of the conventional light source that is being replaced, the area that is available for the heat-dissipating structure is often too small to provide adequate heat transfer without incurring substantial costs to provide a large area heat-transfer surface that fits in a restricted space that was previously occupied by the conventional light source. If the heat-dissipating structure is to be part of the existing luminaire, attachment of the heat-dissipating structure to the existing luminaire can present significant challenges.

For example, consider an existing fluorescent light fixture that has a number of T8 fluorescent tubes that are to replaced by LEDs. If the replacement light source is to look like a conventional T8 fluorescent tube, the heat-dissipating structure must fit into a cylindrical tube that has a diameter of 1 inch and a length equal to that of the fluorescent tube being replaced. This constraint limits the power output of the replacement light source and/or increases the cost by requiring a more complex heat-dissipating structure that includes fins or the like that must fit into one half of the cylindrical replacement source.

If the replacement light source does not match the form factor of the light source being replaced, a new method for attaching the replacement to the existing fixture is needed. Methods that utilize adhesives or mechanical fasteners present a new set of problems. Mechanical fasteners often require that new holes must be drilled in the existing fixture to insert one part of the fastener so that a screw can be used to attach the replacement light source. In many cases, the existing light source cannot be conveniently removed to make these alterations, as it is attached to structural members of the building. Hence, the alterations to the existing fixture must be made in place which incurs significant costs. In addition, the type of fasteners that can be utilized are limited by the fact that all sides of the existing fixture cannot be conveniently accessed.

If adhesives are used, replacing the new light source when it fails can present additional problems. Furthermore, the surfaces of many existing fixtures are painted or otherwise coated with compounds that are not necessarily good surfaces for adhesive attachment. In addition, the adhesive must withstand the temperature cycling of the new light source.

SUMMARY OF THE INVENTION

The present invention includes a light module and method for using the same. The light module includes a heat-conducting structure and a plurality of LEDs bonded to a heat-conducting structure. The LEDs are bonded to a first surface of the heat-conducting structure and are mounted on the heat-conducting structure such that at least 50 percent of the heat generated by the LEDs is transferred to the heat-conducting structure. The heat-conducting structure includes a ferromagnetic material and is structured such that the heat-conducting structure bonds magnetically to a heat-dissipating structure with sufficient force to support the light module during the normal operation thereof when the light source is placed against the heat-dissipating structure. The present invention can be utilized for retrofitting an existing light fixture having an enclosure that includes a ferromagnetic material and a plurality of legacy light sources. The light module replaces one of the legacy light sources and is mounted on the enclosure magnetically such that the light module is supported on the enclosure and heat generated in the light source is dissipated by the enclosure.

BRIEF DESCRIPTION OF THE DRAWINGS

FIGS. 6A and 6B illustrate the upgrade process for a light source based on incandescent light bulbs.

DETAILED DESCRIPTION OF THE PREFERRED EMBODIMENTS OF THE INVENTION

Figure 1:
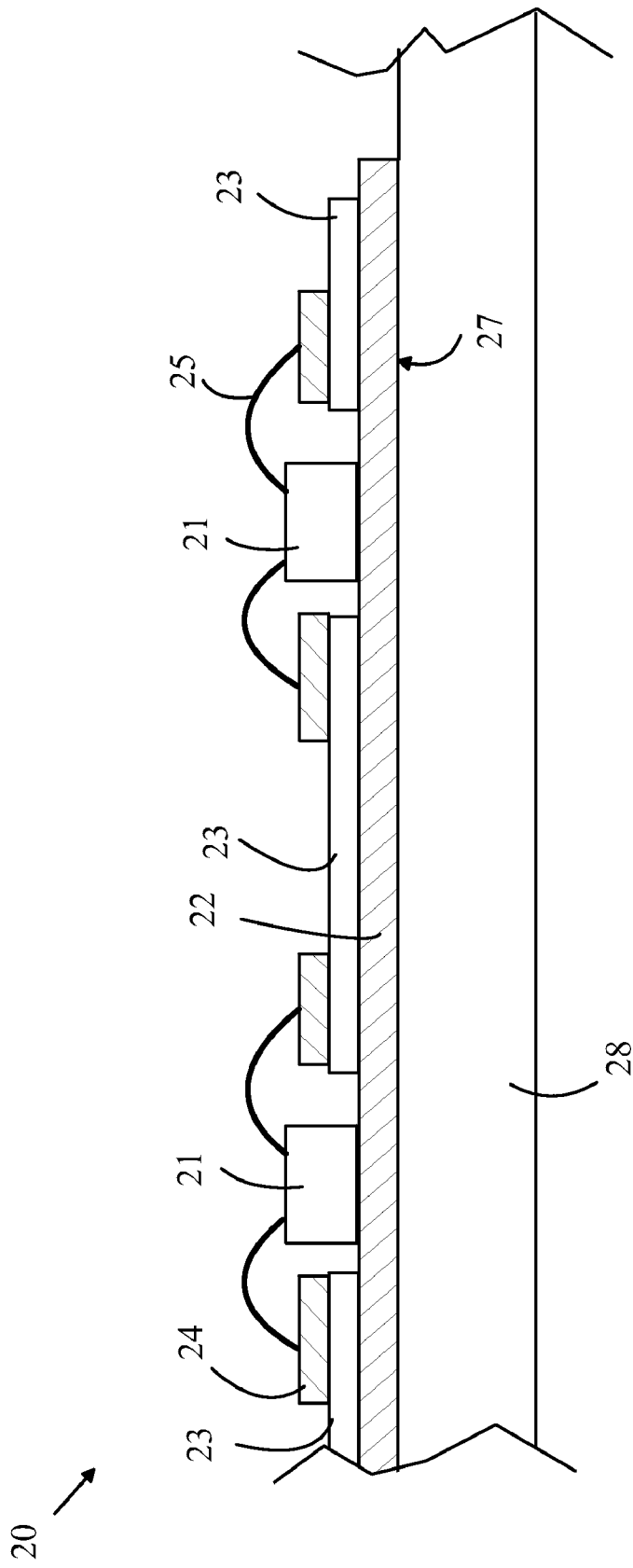
FIG. 1 is a cross-sectional view of a portion of a prior art LED-based light source.

The manner in which the present invention provides its advantages can be more easily understood with reference to FIG. 1, which is a cross-sectional view of a portion of a prior art LED-based light source. Light source 20 includes a plurality of LEDs 21 that are mounted on a heat-conducting substrate 22 such as a layer of metal that is part of a printed circuit board. Substrate 22 has an insulating layer 23 on which patterned metallic traces 24 are provided for powering the LEDs. The LEDs are connected to the traces by wire bonds such as bond 25.

Light source 20 may also include a layer of phosphor over the LEDs that converts all or part of the light from the LEDs to light having a different spectrum. For example, a layer of yellow-emitting phosphor is often used over a blue-emitting LED to create a "white" light source. To simplify the drawing, the phosphor layer has been omitted.

In applications in which light source 20 is to replace a conventional light source such as a fluorescent tube or bank of such tubes to provide lighting over a large area, a large number of LEDs must be utilized to achieve an equivalent illumination level. Since the cost of the LEDs is significant, high power LEDs are preferred to minimize the number of LEDs that are needed. As a result, the LEDs generate a significant amount of heat that must be removed to ensure that the operating temperature of the LEDs is in a satisfactory range. For example, a T12 or T8 fluorescent tube typically generates 70 to 100 lumens per inch of tube while consuming approximately 0.9 watts of power per inch of tube. Hence, an LED replacement light source needs to generate 70 to 100 lumens per inch of light source. Currently, white light sources based on GaN blue-emitting LEDs generate 70 to 100 lumens per watt. Hence, the LED replacement source will generate about 1 watt of heat for each inch along the light source to provide a replacement for the higher efficiency fluorescent tubes. If a lower efficiency fluorescent tube is being replaced, the heat that must be dissipated could be as low as 0.5 watts. On the other hand, an LED replacement light source could provide more light than existing fluorescent tubes of the length being replaced, and hence, heat dissipations in excess of 2 watts/inch of fluorescent tube could be required.

This heat needs to be dissipated without raising the temperature of the LEDs beyond the point at which an unacceptable decrease in the electrical conversion efficiency of the LEDs is incurred or a temperature at which the life of the LED is reduced. Typically, a maximum temperature of 70° C. is the operating limit; however, higher temperatures could be utilized with some LEDs, for example limits of 100° C. or 150° C. could be utilized.

In prior art high power LED lighting applications, the heat is removed primarily through substrate 22 via surface 27 shown in FIG. 1. Typically, light source 20 is mounted on another surface that transfers the heat that flows through substrate 22 to a heat-dissipating surface that interfaces with the ambient environment. To move the heat to the final heat-dissipating surface, a significant temperature difference between the temperature of the LEDs and the environment is needed or surface 27 must be held at or near ambient temperature. To reduce the temperature at surface 27, substrate 22 must be in thermal communication with a heat-dissipating structure 28 whose interface area with the air is much larger than the area of surface 27.

Typically, the final details of the heat-dissipating structure 28 must be provided by the lighting system designer, not the manufacturer of light source 20. This complicates the lighting system design process and increases both the cost of the lighting system and time needed to introduce a new lighting system into the market. Furthermore, as noted above, in applications in which an existing extended source such as plurality of fluorescent tubes is being retrofitted with an LED-based light system, the designer is constrained in terms of the heat-dissipating surfaces that can be utilized.

Figure 2A:
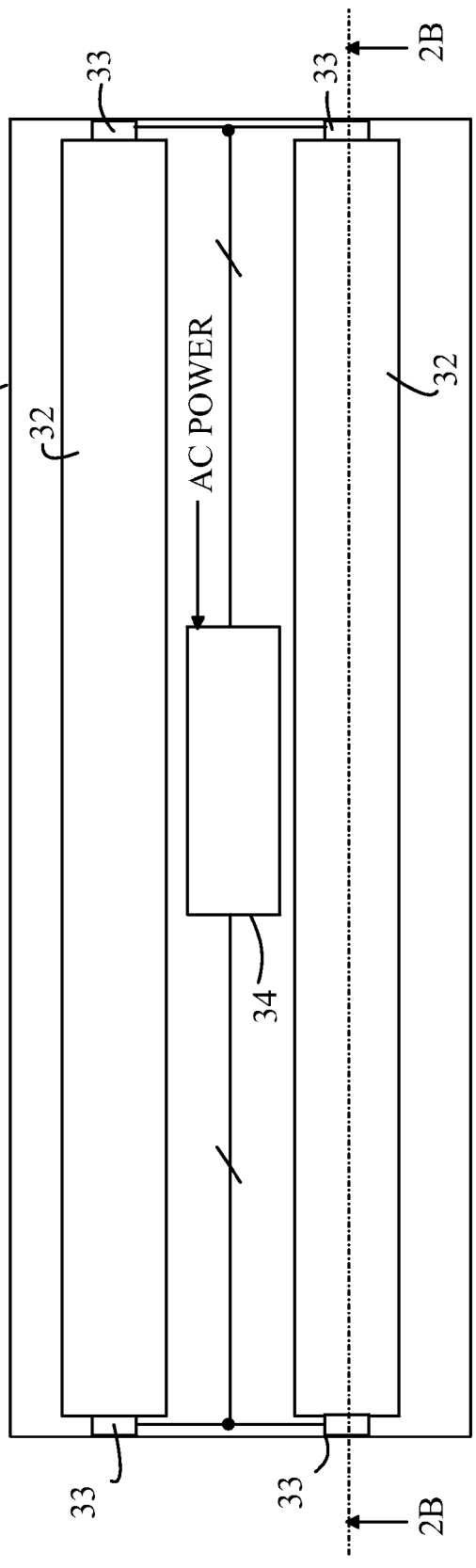
FIG. 2A is a view from underneath a typical prior art fluorescent tube lighting assembly.
Figure 2B:
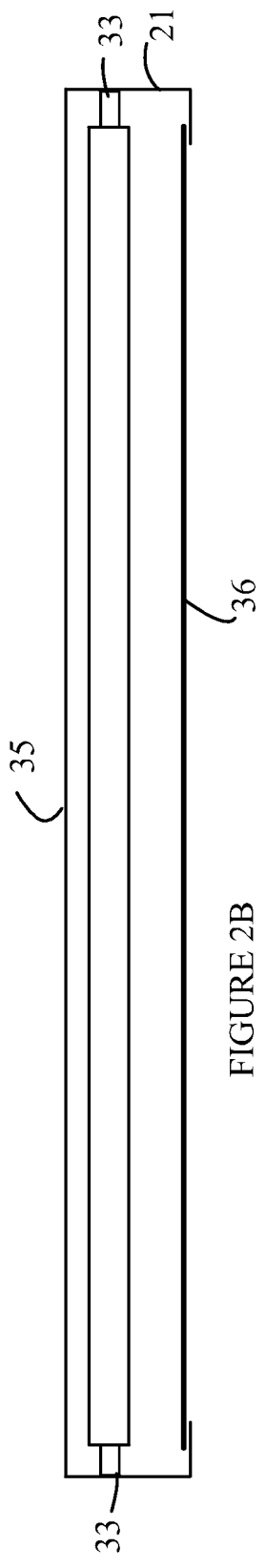
FIG. 2B is a cross-sectional view of lighting assembly 30 through line 2B-2B.

The present invention is based on the observation that many existing conventional light sources are housed in metal enclosures that are constructed from steel or iron and that could be utilized as the heat-dissipating structure for the replacement LED light source. For example, fluorescent fixtures of the type used to illuminate offices and stores have a plurality of fluorescent tubes that are mounted in a steel enclosure that is accessed from under the fixture. The manner in which the present invention provides its advantages can be more easily understood with reference to FIGS. 2A and 2B. FIG. 2A is a view from underneath a typical prior art fluorescent tube lighting assembly, and FIG. 2B is a cross-sectional view of lighting assembly 30 through line 2B-2B. Light source 30 includes an enclosure 31 that houses two fluorescent tubes shown at 32 and a ballast 34 for powering the fluorescent tubes. Light source 30 also includes a diffuser plate 36 that is not shown in FIG. 2A. The fluorescent tubes are inserted into connectors 33 that are connected to ballast 34 and provide the power for operating the fluorescent tubes.

Conversion systems for converting fluorescent tube lighting to LED lighting are available commercially. In one scheme, the ballast is either replaced by a power supply for providing a constant current source to the LEDs or the connectors 33 are directly wired to the AC power line and the ballast eliminated. The fluorescent tubes are then replaced by lighting elements based on LEDs that emulate a conventional fluorescent tube in shape and appearance. The replacement tubes are constructed from a light source having a design that is similar to that shown in FIG. 1 with the LEDs pointing down into the room and the heat being dissipated from the back surface of the printed circuit board.

These replacement tubes plug into the same connectors as the fluorescent tubes that they replace after the ballast has been replaced or eliminated. Since the fluorescent tube replacements are not in contact with enclosure 31 over an area that would allow direct heat transfer to the enclosure, the fluorescent tube replacements must include the heat-dissipating structure that transfers the heat generated by the LEDs to the surrounding air. If the replacement tubes operate off of AC power, the fluorescent tubes must also include a power converter that also generates heat that must be dissipated to the surrounding air. This heat must be dissipated over the back surface of the replacement tube, i.e., the portion that faces the back of enclosure 31 and does not emit light into the room being illuminated. The heat-dissipating structure needed to provide the transfer over this small area significantly increases the cost of the replacement tubes and limits the amount of light that can be generated in a single replacement tube.

In principle, a conventional LED light source of the type shown in FIG. 1 could be mounted on a metal wall of enclosure 31 and connected to a replacement ballast or directly to the AC power. However, the attachment presents problems. If the light source is attached by a mechanical fastener, the enclosure requires modification to accept the fastener. For example, holes must be drilled in the enclosure to accommodate self-threading screws. In general, existing enclosures cannot be conveniently removed for modification; hence, this modification activity must be carried out during off-business hours. If the light source is attached to the wall by a heat-conducting adhesive, later removal of the light source becomes problematic. In addition, the adhesive bond must withstand the temperature cycling of the bond over a period of years. Finally, the walls of the enclosure are typically painted, and hence, may not provide a suitable surface to bond the adhesive.

Figure 3A:
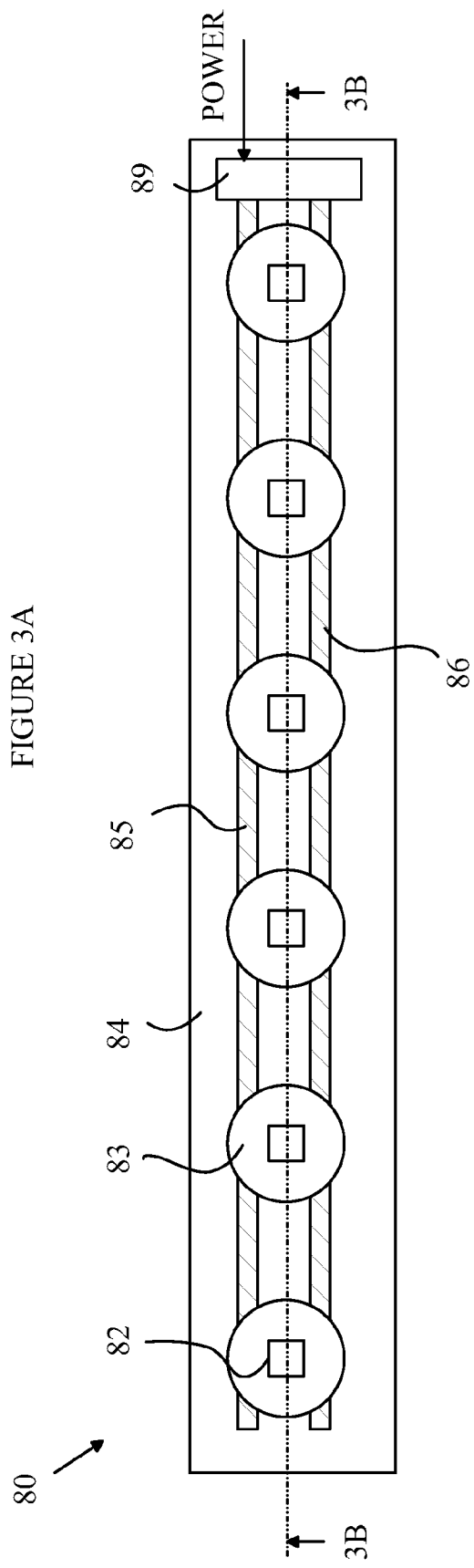
FIGS. 3A and 3B illustrate one embodiment of a light module according to the present invention.
Figure 3B:
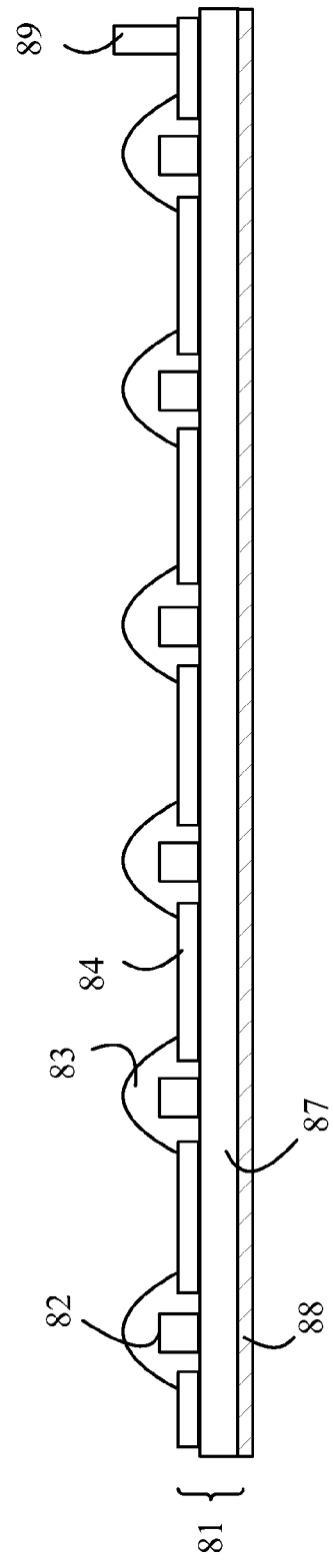

The present invention is based on the observation that these metal enclosures are typically constructed from steel or iron, and hence, the replacement light source can be bonded to the wall magnetically without requiring modification of the enclosure or a heat-conducting adhesive. Refer now to FIGS. 3A and 3B, which illustrate one embodiment of a light module according to the present invention. FIG. 3A is a top view of light module 80, and FIG. 3B is a cross-sectional view of light module 80 through line 3B-3B shown in FIG. 3A. Light module 80 is constructed from a plurality of LED dies 82 that are attached to a metal clad printed circuit board 81 that includes a metal layer 87 to which the LED dies are bonded using a heat-conducting bonding agent.

The dies are covered with a phosphor layer 83 that converts part of the light generated by the dies to light of a different optical spectrum. In one aspect of the invention, the LEDs emit blue light, and the phosphor converts some of the blue light to yellow light such that the resultant light source appears white to a human observer.

The LEDs are powered from circuit trace 85 and 86 that are formed on insulating layer 84. The dies are connected in parallel in light module 80; however, embodiments in which the dies are connected in series or some combination of series and parallel connections could also be utilized. The dies are powered from a power module 89 that is connected either to a replacement ballast or directly to the AC power. The form of power module 89 will depend on the type of input power.

Figure 4:
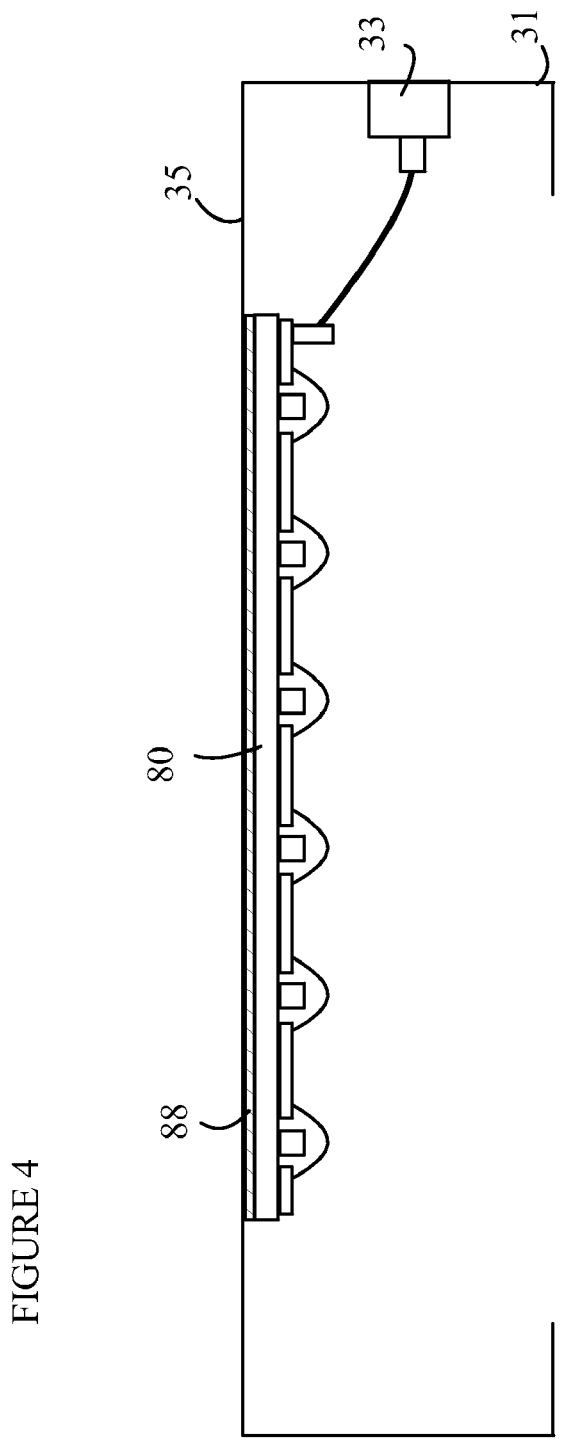
FIG. 4 is a cross-sectional view of a light source in which light module 80 has been attached to replace a conventional fluorescent tube.

Light module 80 includes a layer 88 of ferromagnetic material such as iron or nickel. Refer now to FIG. 4, which is a cross-sectional view of a light source in which light module 80 has been attached to replace a conventional fluorescent tube. In one aspect of the invention, layer 88 is magnetized such that layer 88 will bond to a ferromagnetic surface with sufficient force to hold light module 80 against that surface with sufficient force to support the weight of light module 80 and remain bonded even during mechanical shocks such as those that occur during earthquakes. In the case shown in FIG. 4, light module 80 is attached to back wall 35 of enclosure 31 and connected to one of the power connectors 33 after the ballast has been replaced or eliminated. In the later case, the AC power is wired directly to connector 33. To simplify the drawing, the details of the power conversion have been omitted.

Refer again to FIG. 3B. If a pre-existing printed circuit board is utilized, layer 87 is typically constructed from copper or aluminum. In this case, layer 88 can be applied by plating a layer of ferromagnetic material onto metal layer 87 or by bonding a preformed layer 88 onto layer 87 using a heat-conducting bonding agent. For example, layer 88 could include a ferromagnetic layer to which a thin layer of copper has been formed by electroplating. The copper surface would then be bonded to the exposed copper surface of layer 87 by a solder reflow process. Alternatively, a layer of heat-conducting epoxy could be utilized to bond layers 88 and 87. Utilizing a preformed layer 88 reduces the thickness of material that must be electroplated. In addition, the ferromagnetic layer can be attached to a printed circuit board in an existing process without subjecting that printed circuit board to process conditions that could damage the printed circuit board such as immersing the printed circuit board in an electroplating bath.

It should also be noted that thin, flexible sheet magnets are commercially available. These sheets are used to attach signage to car doors and the like. The sheets could be bonded to the bottom of the printed circuit board.

Alternatively, a non-standard printed circuit board could be utilized in which layer 87 itself includes a layer of ferromagnetic material and layer 88 is omitted. For example, a printed circuit board could be constructed by bonding an insulating layer having a copper layer attached thereto onto a sheet of ferromagnetic material. The copper layer provides the electrical traces. Holes formed in the insulating layer provide the attachment locations for the LED dies.

The light module of the present invention is attached to the surface of the metal enclosure by magnetic force. In the above-described embodiments, the ferromagnetic material is magnetized so that the light module includes the magnetic material. However, embodiments in which the magnet that provides the attachment force is part of the surface to which the light module is attached or a separate layer between the light module and the surface can also be constructed.

Figure 5:
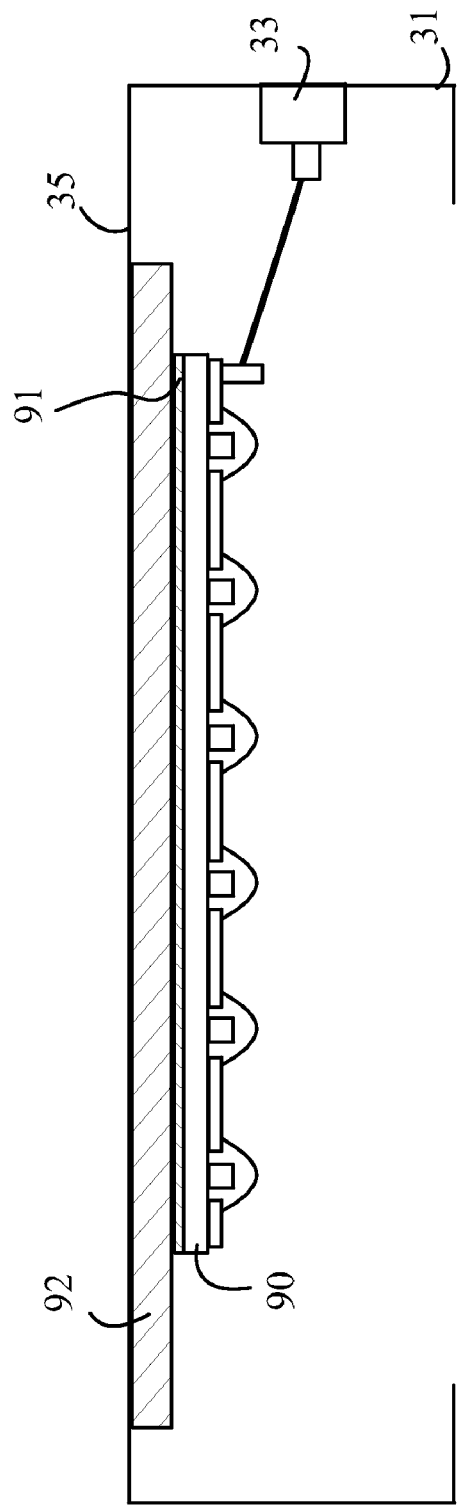
FIG. 5 is a cross-sectional view of a light module according to another embodiment of the present invention that is attached using a separate magnet.

Refer now to FIG. 5, which is a cross-sectional view of a light module according to another embodiment of the present invention that is attached using a separate magnet. Light module 90 includes a ferromagnetic layer 91 on the bottom surface thereof; however, layer 91 is not magnetized prior to mounting light module 90 in enclosure 31. A second layer of ferromagnetic material that is magnetized is shown at 92. Layer 92 is attracted to surface 35 and hence forms a magnetic "double-sided adhesive" layer that bonds light module 90 to enclosure 31.

This arrangement enables a design in which the area of contact between layer 92 and surface 35 is greater than the area of contact between layer 91 and layer 92. As noted above, in many existing enclosures, surface 35 is covered with a layer of paint. This layer of paint increases the thermal resistance of the interface between layer 92 and surface 35. By providing a larger surface area for the heat transfer between surface 35 and layer 92, the additional thermal resistance can be overcome. In addition, layer 92 can be utilized to attach a plurality of light modules to surface 35 without requiring that each light module actually be magnetized.

To provide maximum cooling of the LED dies, the thermal resistance of the heat path between the bottom of the dies and the final heat-dissipating structure should be as low as possible. Refer again to FIG. 3B. The thermal resistance of the path from the die to the final heat-dissipating structure depends on the thermal resistivity of the material from which layer 87 is constructed, the thickness of layer 87, and the surface area of the interface between layers 87 and 88. The maximum cooling is achieved when the temperature of layer 87 under the die is the same as the ambient temperature. If layers 87 and 88 are too thin, there will be a hot spot under each die. Hence, the thickness of these layers is chosen such that the temperature of layer 87 is less than some predetermined design value. In one aspect of the invention, the design value is chosen to be 10, 20, 30 or 40° C. above ambient, the particular value being determined by the specific application. In another aspect of the invention, the layers are chosen such that the temperature of the LEDs does not exceed a predetermined temperature that is less than 100° C., and preferably less than 70° C.

To further improve the heat transfer, in one aspect of the present invention, a layer of heat-conducting grease is applied between the various layers that are bound together magnetically. The heat-conducting grease fills in irregularities in the surfaces, and hence, reduces air gaps between the bound surfaces. Since the heat-conducting grease has a thermal resistivity that is much less than air, the thermal resistance of the interface is reduced. It should be noted that as long as the grease does not include any ferromagnetic materials, the grease will not significantly reduce the bonding forces between the surfaces. Furthermore, the magnetic attraction of the two surfaces continues and hence, over time, any excess grease is squeezed out from the interface. In contrast, in systems in which the light module is glued to the final heat-dissipating structure, control of the adhesive thickness presents challenges.

It should also be noted that the present invention compensates for different amounts of thermal expansion and contraction between the magnetically-bonded surfaces during temperature cycling. The surfaces merely slide laterally with respect to one another during such temperature cycling. Hence, the problems encountered with failures of heat-conducting glues due to the differences in thermal expansion are avoided.

It should also be noted that the magnetic attachment system of the present invention can also be utilized for connecting the power supply or replacement ballast to the existing enclosure if the enclosure is constructed from a ferromagnetic material such as steel or iron. The power supplies for converting AC to a constant current source for powering the LEDs are less than 100 percent efficient. Typically, 10 to 20 percent of the AC power is lost as heat that must also be dissipated to the air. The LED replacements for fluorescent tubes dissipate a similar amount of heat per lumen of light generated. In addition, LEDs can generate more light per unit area than fluorescent tubes, and hence, the upgrade of a fluorescent tube light system to LEDs can also increase the amount of light being generated in any given fixture thereby reducing the number of fixtures that are needed. Hence, the power losses in the power supplies can be tens of watts, if not, a hundred watts. In such situations, providing a heat-dissipating structure for the power supplies can also be advantageous.

The above-described embodiments have utilized the upgrading of an existing fluorescent tube light fixture to an LED-based light fixture. However, the present invention can also be advantageously utilized to upgrade other lighting fixtures that include an enclosure made from a ferromagnetic material. Refer now to FIGS. 6A and 6B, which illustrate the upgrade process for a light source based on incandescent light bulbs. FIG. 6A is a cross-sectional view of light fixture 100 prior to being upgraded to fixture 110, and FIG. 6B is a cross-sectional view of the light source after the upgrade. Referring to FIG. 6A, light fixture 100 includes an enclosure 101 in which a plurality of incandescent light bulbs 103 are mounted by connecting each light bulb to a corresponding power socket 104. An optional diffusion plate 102 or other optical element may be included to process the light generated by the incandescent bulbs.

In one embodiment of the present invention, the light fixture 100 is upgraded to light fixture 110 shown in FIG. 6B by replacing the incandescent bulbs with one or more LED-based light sources 120 that include a magnetic attachment system 121 analogous to the attachment systems discussed above. The attachment system bonds the LED-based light sources to enclosure 101, which is constructed from a ferromagnetic material such as steel. The LED-based light sources are powered from a power supply 111 that converts the AC power supplied at one of the power sockets to a constant current source that drives the LEDs. Power supply 100 utilizes a plug 112 that mates with socket 104. In one aspect of the invention, power supply 111 also includes a magnetic attachment system 123. Magnetic attachment system 123 provides a simple mechanism for installing power supply 111. In addition, power supply 111 can include a heat transfer surface that transfers the heat generated therein to attachment system 123 so that the heat in question can be transferred to the air via the walls of enclosure 101.

It will be appreciated from the foregoing discussion that the upgrade of light fixture 100 to light fixture 110 does not require any modifications to enclosure 101 or the application of any adhesives to the surface of enclosure 101. Hence, relatively unskilled personnel can carry out the upgrade in a matter of a few minutes.

While the present invention is particularly useful in situations in which an existing light fixture is to be upgraded in place to an LED-based light fixture, the present invention can also be advantageously used in the construction of a new luminaire. As noted above, high power LED-based light sources often require some form of external heat-dissipating structure to maintain the LEDs at a suitable temperature during operation. The heat-dissipating structure is often supplied by the manufacturer of the luminaire while the LED module is supplied by a separate supplier in the form of a printed circuit board with the LEDs mounted thereon. The heat-dissipating structure often includes a large metallic structure with fins that increase the surface area over which heat is transferred to the air. To reduce the costs of the heat-dissipating structure, a molded iron or steel structure is attractive. By using a magnetically-bonded system for attaching the LED module to the heat-dissipating structure, the heat-dissipating structure is simplified in that it does not need to include holes to attach the LED module. In addition, the same heat-dissipating structure can be used with a variety of different LED modules without requiring that the LED modules have a common mounting arrangement.

In the above-described embodiments, the heat-conducting structure to which the LEDs are bonded is electrically isolated from the LEDs. However, if the LEDs are driven in parallel, the heat-conducting structure can also function as a ground electrode, and hence, only one lead needs to be bonded to the top of the LEDs.

In the above-described embodiments, it is assumed that most of the heat generated by the LEDs is transferred to the heat-conducting structure on which the LEDs are mounted. In practice, some of the heat is transferred to the air above the LEDs. It should be noted that the present invention provides advantages even in those cases in which the fraction of the heat that is transferred to the heat-conducting surface is less than the total heat generated. In one aspect of the invention, the heat transferred to the heat-conducting substrate is greater than 50, 60, 70, 80, or 90 percent of the total heat generated by the LEDs. In another aspect of the invention, the fraction of the heat transferred to the heat-conducting structure that is subsequently transferred to the heat-dissipating structure is greater than 50, 60, 70, 80, or 90 percent of the heat transferred to the heat-conducting structure.

In the above-described embodiments, the ferromagnetic material containing layer is adjacent to the heat-dissipating structure. However, embodiments in which some intermediate heat-conducting layer that is not ferromagnetic is placed between the two structures as part of the heat-conducting structure could also be constructed. The present invention will function so long as the magnetic force bonding the light source to the heat-dissipating structure is sufficient to maintain the light source in place during normal operation including any physical disturbances such as earthquake.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light module comprising:
a heat-conducting structure; and
a plurality of LEDs bonded to a first surface of said heat-conducting structure, said LEDs generating heat when powered, said LEDs being mounted on said heat-conducting structure such that at least 50 percent of the heat generated by said LEDs is transferred to said heat-conducting structure, said heat-conducting structure comprising a ferromagnetic material and being structured such that said heat-conducting structure bonds magnetically to a heat-dissipating structure with sufficient force to support said light module during the normal operation thereof.

2. The light module of claim 1 wherein said ferromagnetic material is magnetized.

3. The light module of claim 1 further comprising an insulating layer overlying portions of said first surface and an electrical conductor deposited on said insulating layer, at least one of said LEDs being connected to said electrical conductor and powered therefrom.

4. The light module of claim 1 wherein said heat-conducting structure is part of a metal clad printed circuit board.

5. The light module of claim 1 wherein said ferromagnetic material comprises iron or nickel.

6. A method for retro-fitting an existing light fixture having an enclosure comprising a ferromagnetic material and plurality of legacy light sources, at least one of said legacy light sources being powered through a connector, said method comprising:
replacing at least one of said legacy light sources with an LED-based light module, said LED-based light module comprising:
a heat-conducting substrate; and
a plurality of LEDs directly bonded to a first surface of said heat-conducting substrate such that heat generated by said LEDs is directly transferred to said heat-conducting substrate, wherein said heat-conducting substrate comprises a second surface comprising a ferromagnetic material;
magnetically attaching said LED-based light module to said enclosure; and
powering said LED-based light module from said connector.

7. The method of claim 6 wherein said ferromagnetic material in said LED-based light source is magnetized.

8. The method of claim 6 wherein said magnetically attaching said LED-based light module to said enclosure comprises providing a layer of magnetized material between said enclosure and said LED-based light module.

9. The method of claim 6 wherein said LEDs generate heat and said second surface has an area sufficient to transfer at least 50 percent of said heat to said enclosure without causing said LEDs to operate at a temperature greater than 100° C.

10. The method of claim 9 wherein said second surface has an area sufficient to transfer at least 50 percent of said heat to said enclosure without causing said LEDs to operate at a temperature greater than 70° C.

11. The method of claim 6 wherein powering said LED-based module comprises providing a power supply that is separate from said LED-based light module, said power supply being connected to said connector and said LED-based module.

12. The method of claim 11 wherein said power supply is magnetically attached to said enclosure.

13. A luminaire comprising:
a heat-dissipating structure comprising a first ferromagnetic material; and
an LED-based module, said LED-based module comprising:
a heat-conducting substrate; and
a plurality of LEDs directly bonded to a first surface of said heat-conducting substrate such that heat generated by said LEDs is directly transferred to said heat-conducting substrate, wherein said heat-conducting substrate comprises a second surface comprising a second ferromagnetic material, wherein one of said first and second ferromagnetic materials is magnetized and wherein said heat-dissipating structure and said heat-conducting substrate are bound together by a magnetic field provided by said magnetized ferromagnetic material.

14. The luminaire of claim 13 wherein said heat-dissipating structure comprises an enclosure that surrounds said LED-based module.

15. The luminaire of claim 13 further comprising a power supply that converts AC power to DC power that powers said LED-based module, said power supply comprising a ferromagnetic material that causes said power supply to be magnetically bound to said heat-dissipating structure.

16. The luminaire of claim 13 wherein said LEDs generate heat and said second surface has an area sufficient to transfer at least 50 percent of said heat to said heat-dissipating structure without causing said LEDs to operate at a temperature greater than 100° C.

17. The luminaire of claim 16 wherein said LEDs generate heat and said second surface has an area sufficient to transfer at least 50 percent of said heat to said heat-dissipating structure without causing said LEDs to operate at a temperature greater than 70° C.

18. The luminaire of claim 13 wherein said magnetized ferromagnetic material comprises a separate layer of magnetized material that is bound to both said heat-dissipating structure and said second surface of said heat-conducting substrate.

* * * * *